United States Patent
Söderbärg et al.

(10) Patent No.: US 6,326,292 B1
(45) Date of Patent: Dec. 4, 2001

(54) SEMICONDUCTOR COMPONENT AND MANUFACTURING METHOD FOR SEMICONDUCTOR COMPONENT

(75) Inventors: Anders Söderbärg, Uppsala; Håkan Sjödin, Knivsta, both of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/193,181

(22) Filed: Nov. 16, 1998

(30) Foreign Application Priority Data

Nov. 17, 1997 (SE) .................................... 9704211

(51) Int. Cl.[7] ................. H01L 21/44; H01L 21/8222; H01L 29/76
(52) U.S. Cl. ................. 438/597; 438/329; 438/334; 438/355; 438/359; 438/406; 438/455; 257/370; 257/539; 257/577; 257/586; 257/621; 257/904
(58) Field of Search .................... 438/597, 355, 438/406, 455, 329, 334, 359; 257/370, 380, 538, 539, 577, 586, 621, 904

(56) References Cited

U.S. PATENT DOCUMENTS

| | | |
|---|---|---|
| 4,704,368 * | 11/1987 | Goth et al. .................... 438/329 |
| 4,717,682 | 1/1988 | Taka et al. . |
| 5,057,443 | 10/1991 | Hutter . |
| 5,109,263 * | 4/1992 | Nanba et al. ................... 438/334 |
| 5,283,454 | 2/1994 | Cambou . |
| 5,358,884 | 10/1994 | Violette . |
| 5,478,758 | 12/1995 | Easter . |
| 5,643,821 * | 7/1997 | Beasom .......................... 438/355 |

FOREIGN PATENT DOCUMENTS

| | | |
|---|---|---|
| 0 392 954 | 10/1990 | (EP) . |
| 0 547 711 | 6/1993 | (EP) . |
| 0 767 499 | 4/1997 | (EP) . |
| 0767499A2 * | 4/1997 | (EP) ................. H01L/21/331 |

* cited by examiner

*Primary Examiner*—Matthew Smith
*Assistant Examiner*—Igwe U. Anya
(74) *Attorney, Agent, or Firm*—Burns, Doane, Swecker & Mathis, L.L.P.

(57) ABSTRACT

A semiconductor includes a buried conducting layer, such as a buried collector, comprises a trench, the walls of which are covered with a layer of a material in which dopant ions diffuse faster than in monocrystalline silicon. A contact area is doped in close proximity to the trench wall. The dopants will diffuse through the layer and form a low resistance connection to the buried layer. The layer may comprise polysilicon or porous silicon, or a silicide. If the material used in the layer is not in itself conducting, the size of the component may be significantly reduced.

24 Claims, 3 Drawing Sheets

SEMICONDUCTOR COMPONENT AND MANUFACTURING METHOD FOR SEMICONDUCTOR COMPONENT

This application claims priority under 35 U.S.C. §§119 and/or 365 to 9704211-3 filed in Sweden on Nov. 17 1997; the entire content of which is hereby incorporated by reference.

TECHNICAL FIELD

The present invention relates to semiconductor components and in particular to a method of achieving a low resistance in semiconductor components comprising a buried conducting layer, and to such a semiconductor component.

BACKGROUND

Silicon on Insulator (SOI) materials offer a number advantages when making semiconductors, for example latchup immunity, galvanic insulation between components and reduced parasitic capacitance. The SOI material most frequently used today comprises a thin silicon layer, for example between 500 Å and 30 µm thick, on top of an insulating layer, such as silicon dioxide. The active components are located in the silicon layer and are isolated from each other by means of trenches that are etched down to the buried oxide and normally filled with oxide and polycrystalline silicon (polysilicon). Often, a buried conducting layer is used, which is then located adjacent to the buried oxide.

Such a conducting layer may be, for example, a collector in a bipolar component, or, in a field effect component, a drain. For simplicity, in the discussion below, the term collector, or buried collector, is used. Also the term collector resistance is used to describe the resistance from a contact at the surface to the buried conducting layer.

Depending on the component type, the component also comprises other doped areas, such as a base and an emitter in a bipolar component, a gate and a source in a field effect component, and an anode or a cathode in a diode.

To minimize costs, the area of the components should be minimized. Also the component's performance must be good like the collector resistance that should be low. The use of trenches enables the collector resistance to be minimized, if the trench wall is doped. This doped area surrounds the component and extends down to the buried collector. An alternative way of minimizing the collector resistance is to make a deep diffusion from the surface near the collector contact down to the buried collector. The dopants in the buried collector then at the same time diffuse upwards. This diffusion must be compensated for by using a thicker silicon layer. This adds an extra masking step to the manufacturing process, and it becomes more difficult to obtain insulation by means of trenches.

To minimize the area of the component, the trench wall may be kept without doping. An area of an opposite doping type, can then be placed relatively close to the trench, to form, for example, a base, an anode or a cathode. This results, however, in a degraded component performance in terms of an increased collector resistance. As a result of this, especially power transistors must be made very big.

SUMMARY

It is an object of the present invention to obtain a semiconductor component, with a buried collector, having a low collector resistance.

It is another object of the invention to obtain a comparatively small semiconductor component.

These objects are achieved according to the invention by a method of achieving a low resistance connection to a buried conducting layer in or below a device layer constituting part of a semiconductor component, said method comprising the following steps:

etching at least one trench in the device layer, delimiting the area of an active component;

applying a trench wall layer of a material in which a dopant diffuses faster than in the substance in which the buried layer is located, on the walls of the trench;

If an area on the surface of said active component in direct connection with the trench wall layer is doped, the dopant of this area will diffuse through said trench wall layer, and a short way into the device layer to form a contact to the buried layer.

The trench wall layer may comprise polysilicon or porous silicon, or a metal silicide. If polysilicon or porous silicon is used, the trench wall will only be conducting in the vicinity of the doped contact area. All other parts of the trench wall may therefore be placed arbitrarily near any other doped areas of the component, and even adjoining them.

Silicides are in themselves conductors; using a silicide will therefore result in an improved contact. On the other hand, the silicide cannot be used as near the base area of the component as polysilicon or porous silicon. The size of the component will therefore not be reduced compared to prior art components if silicide is used.

The invention offers the following advantages:

The semiconductor component with a low collector resistance may be achieved without any additional masking steps.

The yield and the reliability of the component can be increased, making use of a near by getter centre. Getter centres are areas that will capture metallic impurities that can otherwise degrade the performance of the component.

The upper silicon layer can be made thinner than when conventional techniques, with a deep diffusion from the top surface down to the buried collector are used. The component can be made smaller than with conventional techniques, such as doping of the trench walls. If the trench according to the invention is formed at an early stage, it will function as a getter centre, gettering metallic impurities.

DETAILED DESCRIPTION

Figure 1:
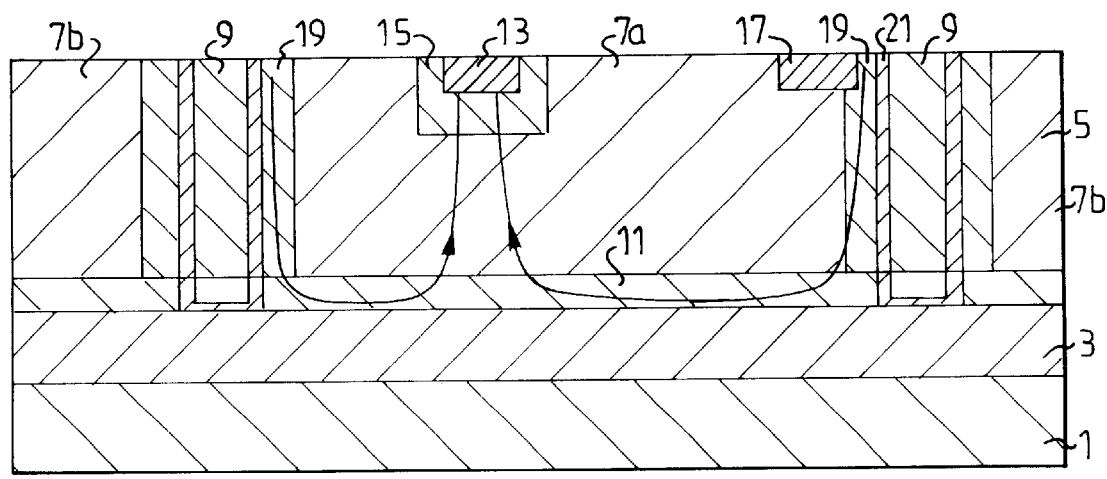
FIG. 1 is a cross-sectional view of a prior art bipolar transistor made in an SOI material.

FIG. 1 is a cross-sectional view of a prior art transistor made in an SOI material. On a substrate layer 1, lies an insulating layer 3, for example, of silicon dioxide. On the insulating layer there is a silicon layer 5 comprising the active components 7a, 7b, separated by trenches 9 providing lateral insulation between the components. Here, only one of the active components 7a will be considered. A buried collector 11 is located in the silicon layer 5, adjacent to the insulating layer 3.

An emitter 13 is located at the surface of the active component 7a, surrounded by a base 15, in the way common in the art. A collector contact 17 is located at the surface of the active component 7a, close to the trench wall. An area 19 of the trench wall has been doped, to provide a low-resistance connection from the collector contact 17 to the buried collector 11.

The trench 9 is normally formed according to the following:

The trench is etched in a conventional way down to the buried oxide. The trench wall is then doped in a conventional way, for example, with doping impurities from a gas source in a furnace or by high angle implantation. An oxide layer 21 is then grown or deposited in the trench, which is then filled with polysilicon. Because the trench wall 19 has been doped all the way around the component 7a, the distance between the base 15 and the trench wall 19 must be kept large to prevent the formation of a too strong electric field near the base, which might lead to an avalanche breakdown.

Figure 2:
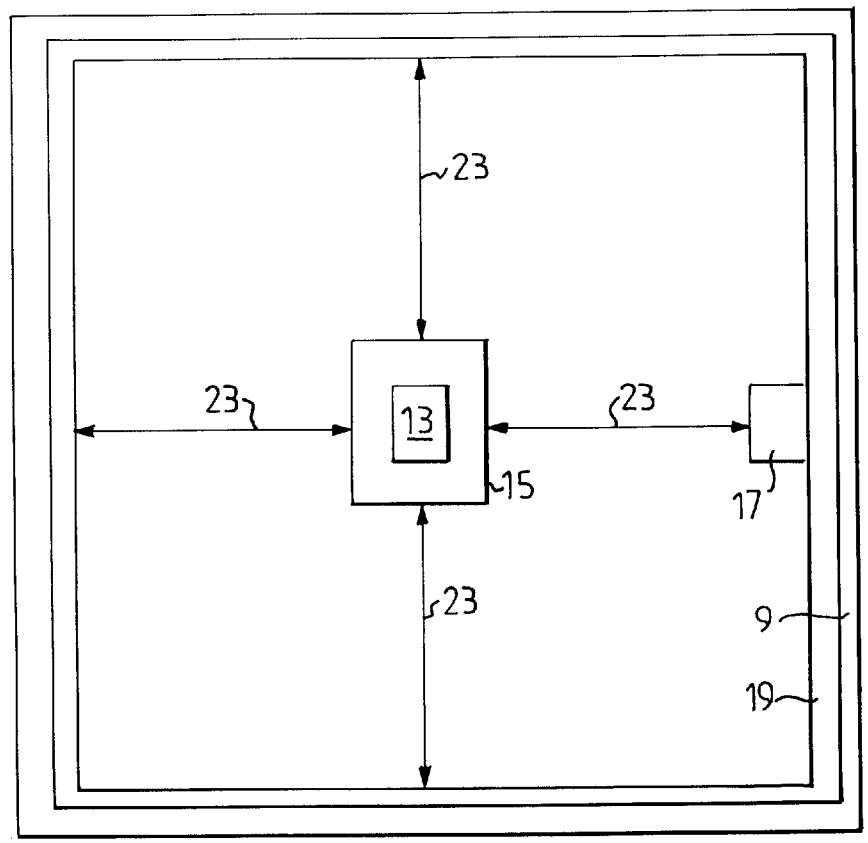
FIG. 2 shows the component of FIG. 1, seen from above.

FIG. 2 shows the component 7a of FIG. 1 seen from above, where the same reference numerals have been used to signify the same components as in FIG. 1. The component 7a is surrounded by the trench 9. The trench wall is doped to serve as a connector between the collector contact 17 and the buried collector (not shown). As can be seen, the base 15 and the trench wall 19 must be kept apart by substantially the same distance in all directions, as shown by the arrows 23.

Figure 3A:
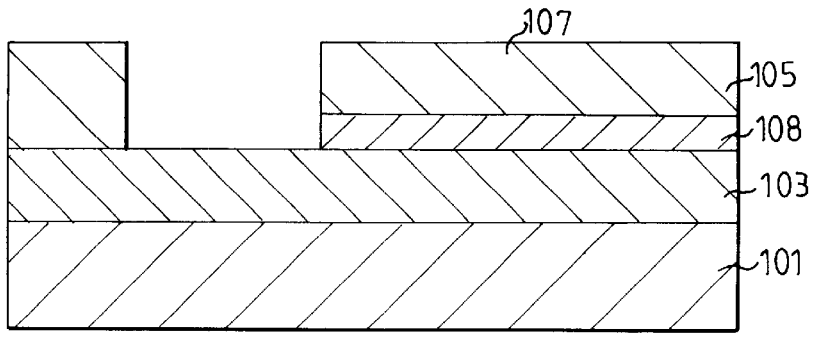
FIGS. 3A–3F are cross-sectional views of parts of a semiconductor in the manufacturing process according to one embodiment of the invention.
Figure 3B:
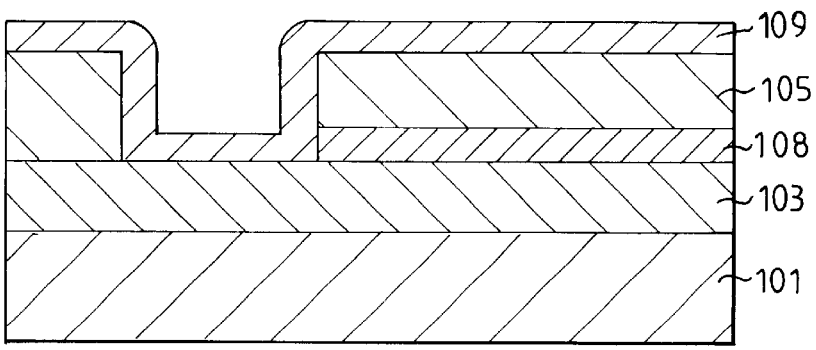
Figure 3C:
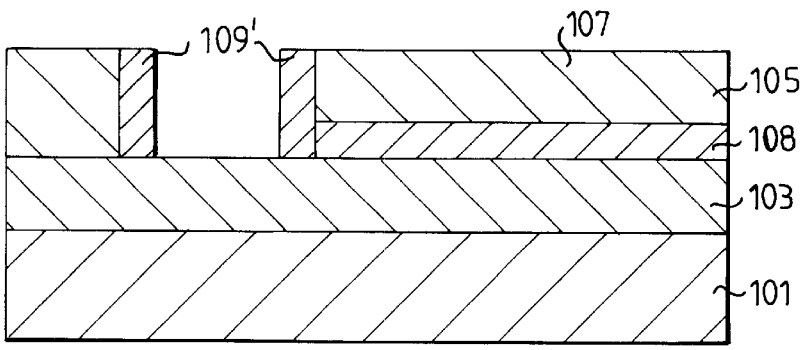
Figure 3D:
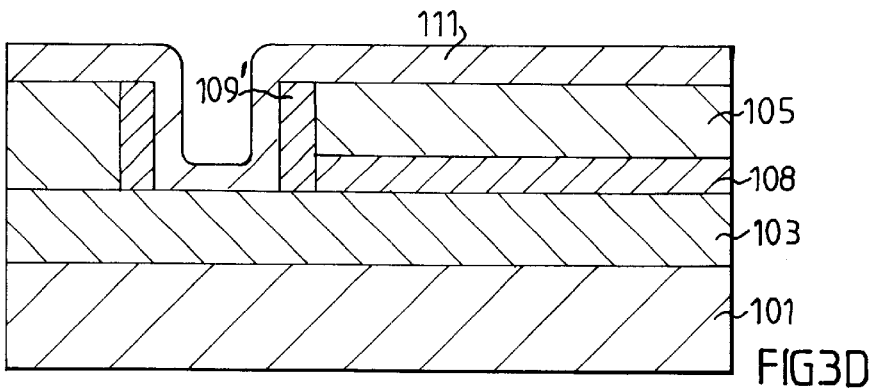
Figure 3E:
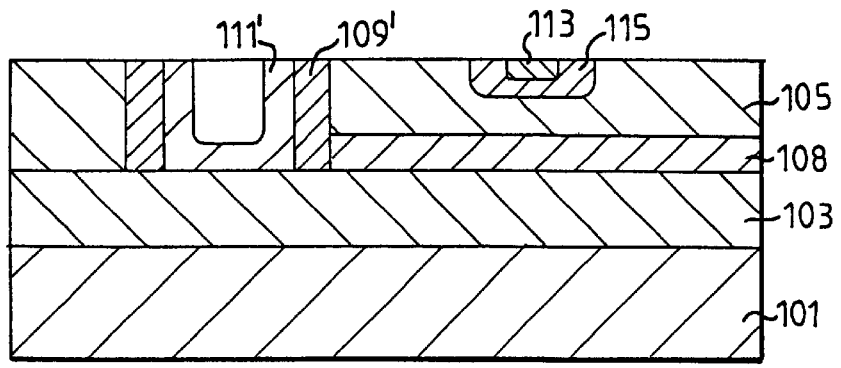
Figure 3F:
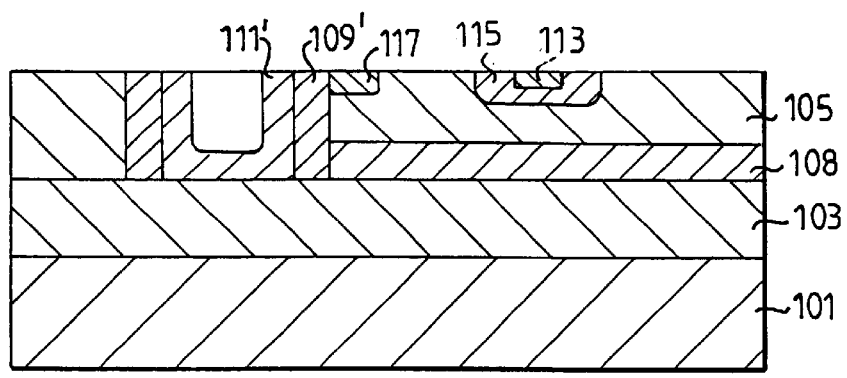
Figure 4:
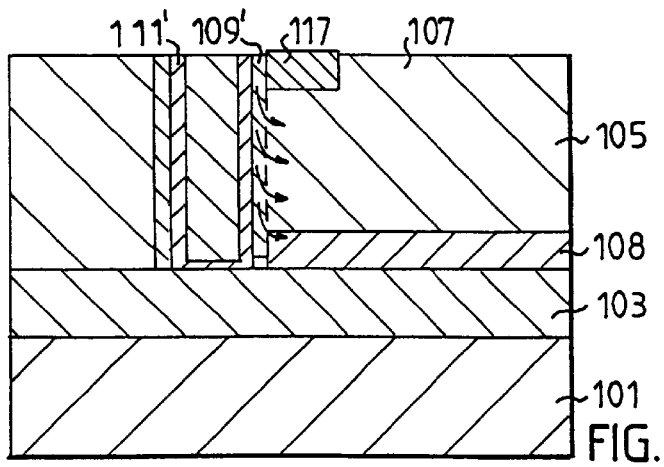
FIG. 4 is a cross-sectional view of a part of the resulting component from the process outlined in FIGS. 3A–3F.

FIGS. 3A to 3F show important steps of the manufacturing process relevant to the production of the low collector resistance connection according to the invention, that is, to produce the component shown in FIG. 4:

FIG. 3A shows a semiconductor component comprising a substrate layer 101, an insulating layer 103 and a silicon layer 105 in which a trench has been formed using conventional masking and etching techniques. The component comprises an active component 107 with a buried conducting layer 108. Before this stage, the surface of the component may be covered with an oxide and/or nitride layer (not shown).

FIG. 3B shows the same semiconductor component with a layer 109 deposited over the surface of the component, including the walls and bottom of the trench.

The layer 109 comprises a material in which dopant ions diffuse significantly faster than in monocrystalline silicon, such as polysilicon, porous silicon or a silicide. In the case of layer 109 being a silicide, a metal is first applied over the component, including the walls and bottom of the trench. During a subsequent heat treatment, silicide is formed at the silicon-metal interface in the trench, the remaining metal is removed, by selectively etching the metal and not the silicide.

FIG. 3C shows the same semiconductor component after the layer 109 has been etched back from the top of the component and from the bottom of the trench, leaving a layer 109' of the material covering the trench walls. The layer 109 does not have to be removed from the bottom of the trench, but usually is, for practical reasons when anisotropic reactive ion etching is used.

FIG. 3D shows the same semiconductor component after a layer 111 of oxide has been grown or deposited over the whole surface of the component. Instead of an oxide, silicon nitride or another insulating material may be deposited.

In FIG. 3E, the trench of the component has been filled with a suitable material, such as polysilicon, and an emitter 113 and a base 115 have been formed, by masking and doping steps, in the way common in the art.

Figure 5:
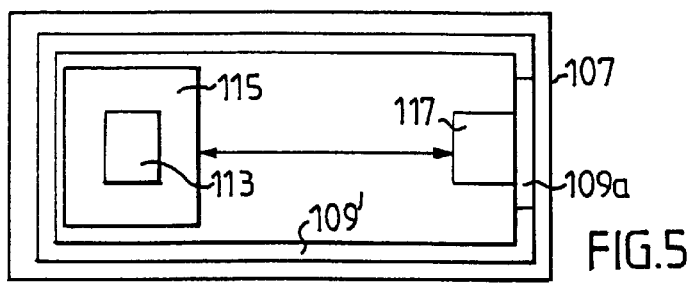
FIG. 5 is the bipolar transistor of FIG. 4, seen from above.

In FIG. 3F, collector contact 117 has been formed, by masking and doping, in the way common in the art. The collector contact 117 is in contact with a part of the layer 109' covering the trench wall (This part 109a is shown in FIG. 5).

The component is then subjected to an annealing process in a way well known in the art. The annealing process is carried out until the dopant reaches the buried collector. The dopant should, however, not be allowed to diffuse so far as to increase the risk for an avalanche breakdown with doped regions. The annealing times and temperatures depend, among other things, on the depth of the trench. Typical values are 1–10 hours at temperatures of approximately 800–1250 C.

As the diffusion velocity of the dopants in polysilicon, porous silicon and silicide is much higher than in monocrystalline silicon, dopants from the collector contact 117 will diffuse through the layer 109a (see FIG. 5) down to the buried collector 108, also diffusing slightly into the adjacent silicon of the active component, and forming a low-resistance connection from the collector contact to the buried collector 108.

Silicides are in themselves conductors. Therefore, the use of a silicide will reduce the collector resistance even more than the use of polysilicon or porous silicon. On the other hand, the distance between the trench wall and the base will have to be increased if the trench wall comprises a conductor. If polysilicon or porous silicon is used, the trench wall will be conducting only in the vicinity of the collector contact, so that this is the only part of the trench that have to be far away from the base, as shown in FIG. 5.

FIG. 4 is a cross-sectional view of part of the component shown in FIG. 3F, to illustrate the diffusion of dopant ions from the collector contact 117 down to the buried collector 108. As can be seen, the dopant diffuses from the collector contact 117 through the layer 109' down to the buried collector 108 and also a short distance into the silicon of the active component 107. The layer 109' and the area of the active component 107 into which the dopant diffuses, together form a low-resistance connection from the collector contact 117 to the collector 108.

The trench formation procedure may be carried out at any point in the manufacturing process of the semiconductor, i.e. before or after the formation of the active components. If the trench according to the invention is formed at an early stage, before any components are formed, it will also function as a getter centre, to capture any metallic impurities that may be introduced in the processing. Even if made at a later stage, the trench according to the invention may still serve to reduce leakage currents but will not be able to getter impurities, or to heal damages such as emitter shorts, to the same degree as if it is present while the active components are being formed.

FIG. 5 shows the active component of FIG. 3F, seen from above, assuming that the material used in the layer 109' is not in itself conducting. In this case, only a portion 109a of the layer 109' and a region of the active component in the vicinity of this portion 109a is conducting, because of the diffusion of dopants from the contact 117. As can be seen, the base 115 may be located very near the trench walls 109' on all sides except the side 109a, at which the collector contact 117 is located. If desired, the trench wall may be placed at a distance of less than 1 $\mu$m from the base, or even adjoining the base 115. This makes the component significantly smaller than the prior art component shown in FIG. 2.

As mentioned in the introduction, the invention is not only applicable to transistors comprising a buried collector, but is equally applicable to other semiconductors comprising a buried conducting layer, such as diodes, thyristors, MOS or DMOS transistors or IGBTs, when a low resistance contact to the buried conducting layer is desired.

What is claimed is:

1. A method of achieving a low resistance connection to a buried conductive layer in or below a device layer forming part of a semiconductor component, said method comprising the following steps:

etching at least one trench in the device layer, delimiting the area of an active component;

applying a layer of a material in which a dopant diffuses faster than in the substance in which the buried conductive layer is located, on the walls of the trench;

doping an area of said active component in direct contact with the layer on the walls of the trench, to form a contact; and annealing the component until the dopant has diffused through the layer applied to the walls of the trench to the buried conductive layer, such that at least one portion of said layer on the wall of said trench is doped, and at least one portion of said layer on the wall of said trench is substantially undoped.

2. A method according to claim 1, wherein the component is annealed until the dopant has diffused down to the buried conductive layer but is still far enough from the other doped region or regions to avoid causing a decrease in the breakdown voltage.

3. A method according to claim 1, further comprising the step of:

depositing or growing a layer of oxide and/or silicon nitride on the layer in the trench.

4. A method according to claim 1, wherein the portion of the trench wall adjacent to the contact is located farther away from the doped region or regions than the rest of the trench wall.

5. A method according to claim 4, wherein the portion of the trench wall adjacent to the contact is located at least twice as far away from the doped region or regions as the rest of the trench wall.

6. A method according to claim 4, wherein the part of the trench wall not adjacent to the contact is located at a distance smaller than 1 $\mu$m from the doped region or regions.

7. A method according to claim 1, wherein polysilicon or porous silicon is used in the layer.

8. A method according to claim 1, wherein a silicide is used in the layer.

9. A method according claim 1, wherein the device layer comprises monocrystalline silicon.

10. A method according to claim 1, wherein the device layer is located on an insulating layer.

11. A method according to claim 1, wherein the buried conductive layer comprises silicide.

12. A semiconductor component comprising a device layer in which at least one active component is located and laterally delimited by a trench and having a buried conductive layer, there being a layer on the wall of said trench of a material in which a dopant diffuses faster than in the substance of the device layer in which the buried conductive layer is located, wherein at least one portion of said layer on the wall of said trench is doped, and at least one portion of said layer on the wall of said trench is substantially undoped.

13. A semiconductor component according to claim 12, wherein there is a contact to the buried conductive layer on the surface of the active component, in direct contact with a doped part of the layer on the wall of said trench.

14. A semiconductor component according to claim 12, wherein the dopant of the contact has diffused through the layer on the wall of said trench to the buried conductive layer, so that a low resistance connection from the contact to the buried conductive layer has been formed.

15. A semiconductor component according to claim 12, wherein the layer comprises polycrystalline silicon or porous silicon.

16. A semiconductor component according to claim 12, wherein the layer comprises a silicide.

17. A semiconductor component according claim 12, wherein the device layer comprising the active component is a silicon layer located on a substrate with an a insulating layer therebetween.

18. A semiconductor component according to claim 12, wherein the portion of the trench wall adjacent to the contact is farther away from the doped region or regions than the rest of the trench wall.

19. A semiconductor component according to claim 18, wherein the portion of the trench wall adjacent to the contact is at least twice as far away from the doped region or regions than the rest of the trench wall.

20. A semiconductor component according to claim 18, wherein the part of the trench wall not adjacent to the contact is located at a distance smaller than 1 $\mu$m from the doped region or region.

21. A semiconductor component according to claim 12, wherein the layer comprises polysilicon or porous silicon.

22. A method according to claim 12, wherein the layer comprises a silicide.

23. A semiconductor component comprising a device layer in which at least one active component is located, said component being laterally delimited by a trench and having at least one doped area and a buried conductor, wherein there is a layer on the wall of said trench of a material in which a dopant diffuses faster than in the substance in which the buried conductor is located;

there is contact on the surface of the active component, in direct contact with a portion of the layer on the wall of said trench; and said portion of the layer on the wall of said trench comprises the same dopants as the conductor contact, forming a low resistance connection from the conductor contact to the buried conductor, whereas at least one other part of the layer on the wall of said trench is substantially without dopants.

24. A semiconductor component comprising a device layer in which at least one active component is located, said component being laterally delimited by a trench and having a base, an emitter and a buried collector, wherein there is a layer of a material in which a dopant diffuses faster than in the substance in which the buried collector is located, on the wall of said trench;

there is collector contact on the surface of the active component, in direct contact with the layer on the wall of said trench; and at least one portion of the layer comprises the same dopants as the collector contact, forming a low resistance connection from the collector contact to the buried collector, whereas at least one other part of the layer on the wall of said trench is substantially undoped.

* * * * *